United States Patent
Lee et al.

(10) Patent No.: US 11,683,753 B2
(45) Date of Patent: Jun. 20, 2023

(54) WIRELESS TRANSMISSION SYSTEM AND POWER SAVING METHOD THEREOF

(71) Applicants: Inventec Appliances (Pudong) Corporation, Shanghai (CN); INVENTEC APPLIANCES CORP., New Taipei (TW); Inventec Appliances (Shanghai) Co. Ltd., Shanghai (CN)

(72) Inventors: Wen-Hsien Lee, New Taipei (TW); Chih-Hsuan Hsiao, New Taipei (TW)

(73) Assignees: INVENTEC APPLIANCES (PUDONG) CORPORATION, Shanghai (CN); INVENTEC APPLIANCES CORP., New Taipei (TW); INVENTEC APPLIANCES (SHANGHAI) CO. LTD., Shanghai (CN)

( * ) Notice: Subject to any disclaimer, the term of this patent is extended or adjusted under 35 U.S.C. 154(b) by 147 days.

(21) Appl. No.: 17/412,552

(22) Filed: Aug. 26, 2021

(65) Prior Publication Data

US 2022/0330145 A1    Oct. 13, 2022

(30) Foreign Application Priority Data

Apr. 9, 2021   (CN) .......................... 202110383296.X

(51) Int. Cl.
*H03H 7/40*       (2006.01)
*H04W 52/02*      (2009.01)

(52) U.S. Cl.
CPC .......... *H04W 52/0209* (2013.01); *H03H 7/40* (2013.01); *Y02D 30/70* (2020.08)

(58) Field of Classification Search
CPC . H03H 7/40; H03H 7/38; Y02D 30/70; Y02D 30/00; H04W 52/0209; H04W 52/02; H04W 52/00
See application file for complete search history.

(56) References Cited

U.S. PATENT DOCUMENTS

| | | | |
|---|---|---|---|
| 11,476,091 B2 * | 10/2022 | Bhutta | ............... H01L 21/02274 |
| 2006/0056377 A1 * | 3/2006 | Wu | ................... H04W 52/0225 |
| | | | 370/332 |

(Continued)

FOREIGN PATENT DOCUMENTS

| | | |
|---|---|---|
| CN | 101835248 A | 9/2010 |
| CN | 103532509 A | 1/2014 |

(Continued)

*Primary Examiner* — Stephen E. Jones
(74) *Attorney, Agent, or Firm* — McClure, Qualey & Rodack, LLP

(57) ABSTRACT

A wireless transmission system comprises an antenna component, a wireless module including a processing unit and a power controlling unit, a tuner connected between the antenna component and the wireless module, and a sensor connected to the wireless module. The tuner is configured to adjust an output bad of the power controlling unit according to a received signal strength indication of the wireless transmission system being greater than a predetermined threshold value, such that multiple different load values are provided for the power controlling unit. The sensor is configured to detect and record a current consumption value corresponding to each load value. In response to the wireless module emitting signals via the antenna component, the processing unit selects the load value corresponding to the lowest of the current consumption values and applies the selected load value to the output load of the power controlling unit.

13 Claims, 3 Drawing Sheets

(56) References Cited

U.S. PATENT DOCUMENTS

2013/0271342 A1    10/2013  Shen
2020/0296762 A1     9/2020  Sun et al.

FOREIGN PATENT DOCUMENTS

CN    107342460 B    7/2020
CN    111886916 A   11/2020

* cited by examiner

WIRELESS TRANSMISSION SYSTEM AND POWER SAVING METHOD THEREOF

This application claims the benefit of People's Republic of China application Serial No. 202110383296.X, filed Apr. 9, 2021, the subject matter of which is incorporated herein by reference.

BACKGROUND OF THE INVENTION

Field of the Invention

The invention relates in general to a wireless transmission system and a power saving method thereof, and more particularly to a wireless transmission system and a power saving method thereof that are able to save power and also provide a good wireless communication quality.

Description of the Related Art

Wireless transmission systems are commonly used in field of wearable devices or IOT devices, these devices are nothing more than battery-powered. The efficiency and power saving of wireless transmission systems have always been developed. How to achieve power saving and has a good quality of wireless communication at same time is a goal that the industry strives to achieve.

SUMMARY OF THE INVENTION

According to one aspect of the present invention, a wireless transmission system is provided. The wireless transmission system comprises an antenna component, a wireless module, a tuner, and a sensor. The wireless module includes a processing unit and a power controlling unit. The tuner is connected between the antenna component and the wireless module. The tuner is configured to be triggered to adjust an output load of the power controlling unit according to that a received signal strength indication (RSSI) of the wireless transmission system is greater than a predetermined threshold value, such that a plurality of different load values are provided for the power controlling unit. The sensor is connected to the wireless module and configured to detect and record a current consumption value corresponding to each of the load values. In response to the wireless module emitting through the antenna component, the processing unit selects the load value corresponding to the lowest of the current consumption values and applies the selected load value to the output load of the power controlling unit.

According to another aspect of the present invention, a power saving method of a wireless transmission system is provided, a power saving method comprises the following steps: adjusting an output load of a power controlling unit according to that a received signal strength indication (RSSI) of the wireless transmission system is greater than a predetermined threshold value, such that a plurality of different load values are provided for the power controlling unit; detecting and recording a current consumption value corresponding to each of the load values; and in response to a wireless module emitting through an antenna component, selecting the load value corresponding to the lowest of the current consumption values and applying the selected load value to the output load of the power controlling unit.

Figures 1, 2:
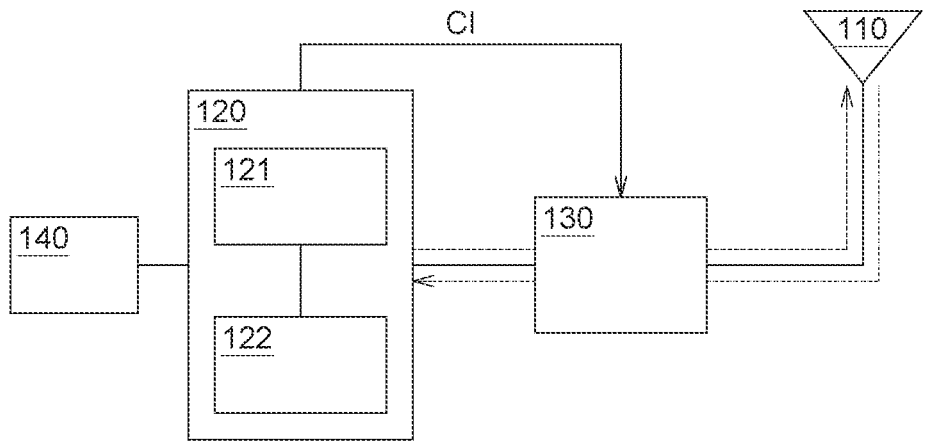
FIG. 1 is a block diagram of configuration of a wireless transmission system according to an embodiment of the present invention.
FIG. 2 is a flow diagram of a power saving method of the wireless transmission system according to the embodiment of the present invention.

Common reference numerals are used throughout the drawings and the detailed description to indicate the same components. The present invention will be more apparent from the following detailed description taken in conjunction with the accompanying drawings.

DETAILED DESCRIPTION OF THE INVENTION

FIG. 1 is a block diagram of configuration of a wireless transmission system 100 according to an embodiment of the present invention. For example, the wireless transmission system 100 is a system applicable in the field of wearable devices, such as true wireless stereo (TWS), smart watches, etc. The wireless transmission system 100 comprises an antenna component 110, a wireless module 120, a tuner 130, and a sensor 140, as shown in FIG.

For example, the wireless module 120 is a Bluetooth module, a iso Wi-Fi module or a ZigBee module. The wireless module 120 comprises a processing unit 121 and a power controlling unit 122. The processing unit 121 and the power controlling unit 122 are electrically connected to each other. The wireless module 120 can receive signals via the antenna component 110 and transmit signals via the antenna component 110. Specifically, the processing unit 121 of the wireless module 120 receives and processes wireless signals from the outside through the antenna component 110, and transmits the processed signals to the external environment through the antenna component 110. For example, the power controlling unit 122 is a power amplifier (PA) for amplifying the output signal of the wireless module 120.

The tuner 130 is connected between the antenna component 110 and the wireless module 120. The sensor 140 is connected to the wireless module 120. For example, the tuner 130 is a load tuner, which is configured to be triggered to adjust the output load of the power controlling unit 122 according to that the received signal strength indicator (RSSI) of the wireless transmission system 100 is greater than a predetermined threshold. As such, a plurality different load values are provided for the power controlling unit 122, That is, load (impedance) matching is performed on the power controlling unit 122. Since the adjustment of the output load of the power controlling unit 122 may reduce the output power and may cause a poor connection quality of the system, it can be ensured that the connection quality of the wireless transmission system 100 would not be affected in a condition that the received signal strength indicator of the wireless transmission system 100 is greater than the predetermined threshold. For example, the sensor 140 is a current sensor. The sensor 140 is configured to detect and record a current consumption value corresponding to each of the load values of the output load of the power controlling unit 122, and to transmit the recorded consumption current value to the processing unit 121.

FIG. 2 is a flow diagram of a power saving method S of the wireless transmission system 100 according to the embodiment of the present invention. As shown in FIG. 2, the power saving method S comprises the following steps S110 to S130. The power saving method S is a method for the wireless transmission system 100 to maintain a certain wireless transmission connection quality and have a better load value at same time, so as to save power of wireless transmission.

In the step S110, according to that the received signal strength indication of the wireless transmission system 100 is greater than a predetermined threshold, adjusting the output load of the power controlling unit 122, such that a plurality of different load values are provided for the power controlling unit 112. That is, as described above, the output load of the power controlling unit 122 can be adjusted through the tuner 130 without affecting the connection quality of the wireless transmission system 100, so as to provide a plurality of different load values for the power controlling unit 122.

In the step S120, detecting and recording the current consumption value corresponding to each of the load values. That is, as described above, the current consumption value corresponding to the output load of the power controlling unit 122 can be detected and recorded by the sensor 140.

In the step S3, in response to the wireless module 120 emitting signals via the antenna component 110, selecting the load value corresponding to the lowest of the aforementioned current consumption values and applying the selected load value to the output load of the power controlling unit 122. It can be known that the corresponding power consumption is also the lowest based on the lowest of the recorded current consumption values. Then, the processing unit 121 can select the load value corresponding to the lowest of the current consumption values and apply the selected load value to the power controlling unit 122. The power controlling unit 122 thus has a better power-saving load to achieve the power-saving effect of wireless transmission.

Figure 3:
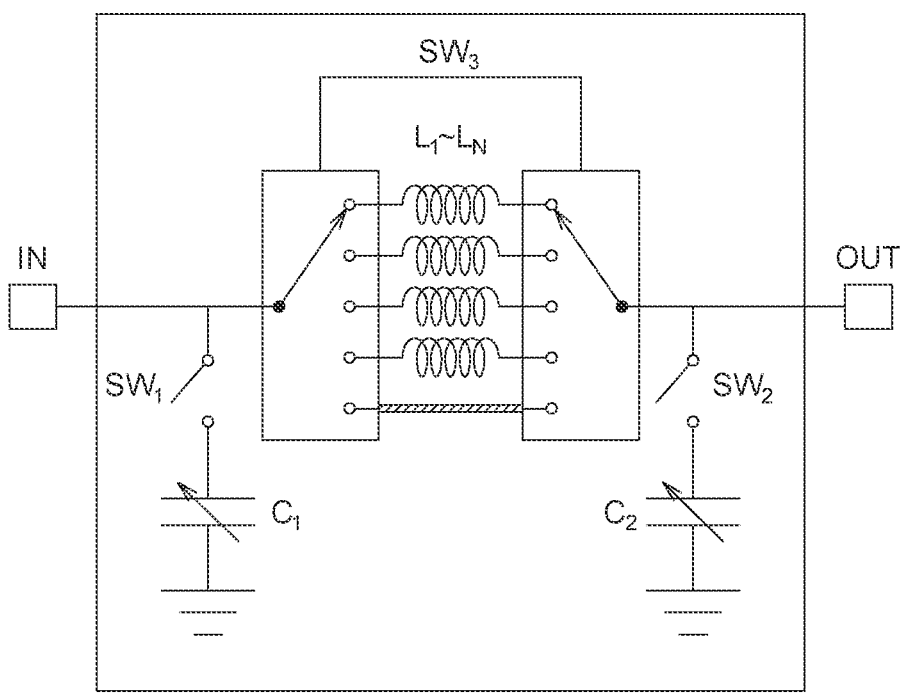
FIG. 3 is a specific configuration diagram of a tuner included in the wireless transmission system according to the embodiment of the present invention.

FIG. 3 is a specific configuration diagram of the tuner 130 included in the wireless transmission system 100 according to the embodiment of the present invention. It can be understood that the input IN shown in FIG. 3 is connected to the wireless module 120 shown in FIG. 1. Also, it can be understood that the output OUT shown in FIG. 3 is connected to the antenna component 120 shown in FIG. 1. In an embodiment, the tuner 130 may include a first capacitor $C_1$ and a second capacitor $C_2$ (such as variable capacitors), a first switch $SW_1$ and a second switch $SW_2$ (such as single-ended switches), a set of serial path components $L_1$ to $L_N$ connected between the first capacitor $C_1$ and the second capacitor $C_2$, and a third switch $SW_3$. The wireless module 120 can further control the tuner 130 to adjust the output load of the power controlling unit 122 through a control interface CI shown in FIG. 1. For example, the control interface CI is a serial peripheral interface (SPI), an inter-integrated circuit ($I^2C$) interface, or a mobile industry processor interface (MIPI).

The first capacitor $C_1$, the serial path components $L_1$ to $L_N$, and the second capacitor $C_2$ can form combinations of different load values through the control interface CI. For example, the first capacitor $C_1$ and the second capacitor $C_2$ may be between 0.5 pF and 3.5 pF, or be an open end based on the state of the first switch $SW_1$ and the second switch $SW_2$. For example, the impedance value of the serial path component $L_1$ to $L_N$, may be between 0.5 nH and 3 nH, or be 0 ohm based on the third switch $SW_3$ switched to a 50 ohm transmission line. The following table 1 takes five modes of experimental simulations as example.

TABLE 1

| Mode | $C_1$ | $C_2$ | L($L_1$ to $L_N$) | current consumption value |
|---|---|---|---|---|
| 1 | 0.5 pF | Open | 2 nH | 33 mA |
| 2 | 2 pF | 0.5 pF | 0 ohm | 20 mA |
| 3 | Open | 0.5 pF | 1 nH | 45 mA |
| 4 | 1 pF | 2 pF | 0.5 nH | 28 mA |
| 5 | Open | Open | 0 ohm | 50 mA |

Figure 4:
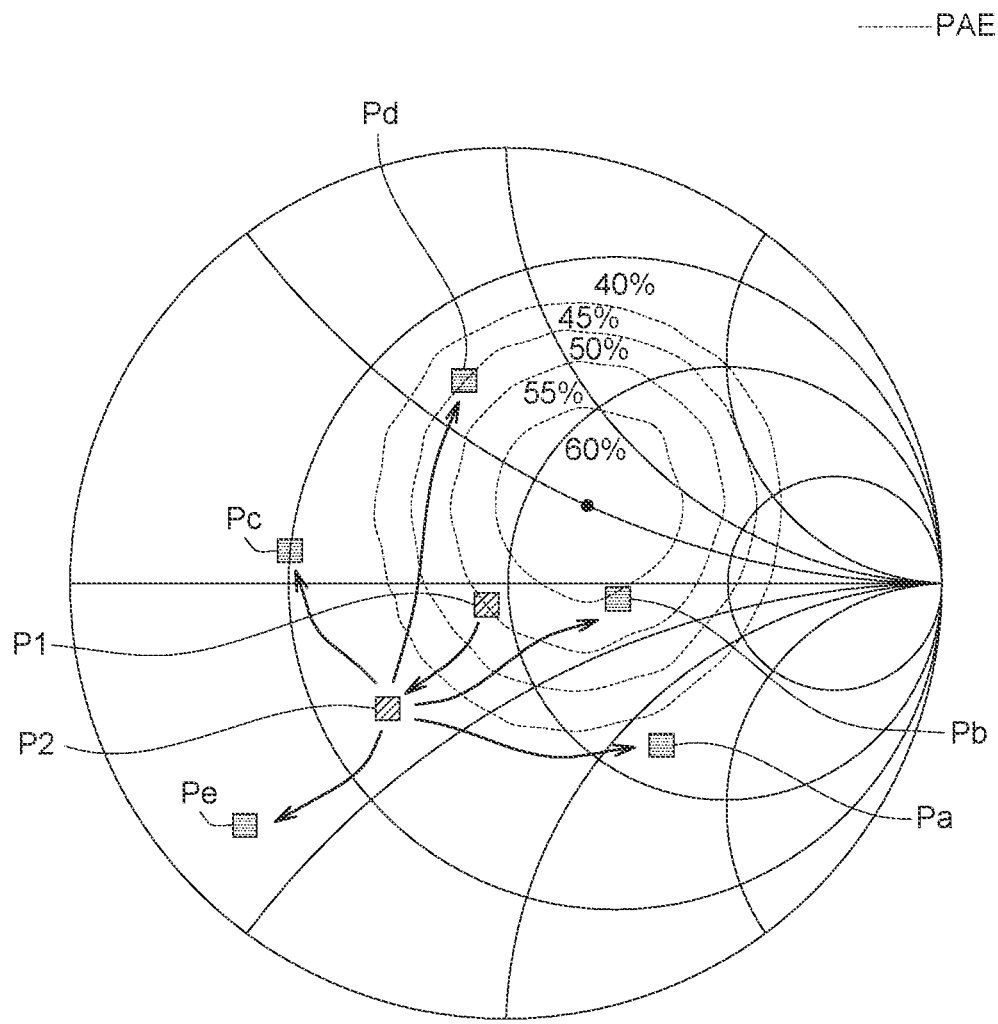
FIG. 4 is a load-performance diagram of a power controlling unit included in the wireless transmission system according to the embodiment of the present invention.

That is, different load combinations like five modes can be randomly formed through the tuner 130, and the current consumption values of the above five modes of load combinations can be detected through the sensor 140, and then the processing unit 121 selects the load value corresponding to the lowest current consumption as the output load of the power controlling unit 122 after comparison and analysis. As shown in Table 1, the mode 2 is taken as the current optimal output load because 20 mA is the lowest, FIG. 4 is a load-performance diagram of the power controlling unit 122 included in the wireless transmission system according to the embodiment of the present invention. In this embodiment, it is assumed that the wireless transmission system 100 is applied to a wireless earphone. Before a user puts the wireless earphone with the wireless transmission system 100 in his/her ears, the performance of the power controlling unit 122 included in the wireless transmission system 100 is initially located at the performance position P1, namely the PAE 50% of the contour line of the power added efficiency, due to the environment factor of antenna.

After the user puts the wireless earphone with the wireless transmission system 100 into his/her ears, the performance of the power controlling unit 122 changes from the performance position P1 to the performance position P2 due to the human body factor (such as differences in ear types or differences in wearing styles). That is, the power controlling unit 122 changes from the performance position P1 to the performance position P2, namely outside the PAE 40% of the contour line of the power-added efficiency. Thus, the power added efficiency decreases. At this time, as described above, the tuner 130 can be triggered to adjust the output load of the power controlling unit 122 according to that the received signal strength indication of the wireless transmission system 100 is greater than a predetermined threshold so as to optimize the power saving of the system in a condition that a good connection quality can be maintained.

If the received signal strength indicator of the wireless transmission system 100 is greater than the predetermined threshold (the receiving threshold of the wireless headset is assumed −75 dBm), the tuner 130 adjusts the output load of the power controlling unit 122. As shown in Table 1 above, five modes are randomly formed (corresponding to performance positions Pa to Pe). The performance positions Pa to Pe have different output load values, and their corresponding performances are also different.

The sensor 140 records the current consumption value of each performance position. Then, the processing unit 121 selects the performance position Pb corresponding to the lowest current consumption as the best power consumption position in the current environment because there is the highest power added efficiency (PAE 55%) at the performance position Pb. As a result, the wireless earphone with the wireless transmission system 100 has been improved from the original in-ear performance position P2 (corresponding to PAE below 40%) to the optimized performance position Pb (corresponding to PAE 60%). The power added efficiency has increased by at least 20%, representing the usage time of the wireless earphone can be increased correspondingly, thereby achieving the effect of power saving.

On the other hand, the wireless transmission system 100 and the power saving method S of the embodiment of the present invention further have an effect of optimizing the signal reception ability during signal reception. In detail, the wireless transmission system 100 is implemented by a time-division duplexing system, and the signal reception and the signal emission are separated. in response to that the signal is received via the antenna component 110, the tuner 130 adjusts the power controlling unit 122 to an original standard load value of the power controlling unit 122, and the processing unit 121 applies the original standard bad value to the output load of the power controlling unit 122. Impedance matching for the original standard load value is generally 50 ohm. That is, the serial path components $L_1$ to $L_N$ of the corresponding tuner 130 (shown in FIG. 3) are switched to a 50 ohm transmission line based on the third switch $SW_3$, which can enable the output load of the power controlling unit 122 to be the original standard load value. Therefore, the wireless transmission system 100 of the embodiment of the present invention can apply different output load settings when performing the signal emission and the signal reception, thus optimizing the power saving effect of signal transmission and not affecting the signal reception performance. That is, the signal reception quality can be maintained. The signal reception performance can even be optimized by the time division duplexing of the wireless transmission system 100.

In conclusion, the wireless transmission system of the embodiment of the present invention selects the load value corresponding to the lowest of the current consumption values through the processing unit and applies the selected load value to the power controlling unit, so that the power controlling unit can has a better output load. Therefore, the output load of the power controlling unit can be dynamically adjusted to achieve a better power added efficiency to achieve the power saving effect of wireless transmission.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A wireless transmission system, comprising:
   an antenna component;
   an wireless module including a processing unit and a power controlling unit;
   a tuner connected between the antenna component and the wireless module, wherein the tuner is configured to be triggered to adjust an output load of the power controlling unit so that a received signal strength indication of the wireless transmission system is greater than a predetermined threshold value, such that a plurality of different load values are provided for the power controlling unit; and
   a sensor connected to the wireless module and configured to detect and record a current consumption value corresponding to each of the load values;
   wherein, in response to the wireless module emitting signals via the antenna component, the processing unit selects the load value corresponding to the lowest of the current consumption values and applies the selected load value to the output load of the power controlling unit.

2. The wireless transmission system according to claim 1, wherein in response to the wireless module receiving signals via the antenna component, the tuner adjusts the power controlling unit to an original standard load value of the power controlling unit, and the processing unit applies the original standard load value to the output load of the power controlling unit.

3. The wireless transmission system according to claim 1, wherein the tuner includes a first capacitor, a second capacitor, and a set of serial path components connected between the first capacitor and the second capacitor, such that multiple combinations of different load values are formed.

4. The wireless transmission system according to claim 1, wherein the power controlling unit is a power amplifier.

5. The wireless transmission system according to claim 1, wherein the wireless module further controls the tuner to adjust the output load of the power controlling unit through a control interface, and the control interface is a serial peripheral interface, an inter-integrated circuit interface, or a mobile industry processor Interface.

6. The wireless transmission system according to claim 1, wherein the load value corresponding to the lowest of the current consumption values has the highest power added efficiency in all the load values.

7. The wireless transmission system according to claim 1, wherein the wireless module is a Bluetooth module, a Wi-Fi module, or a ZigBee module.

8. A power saving method of a wireless transmission system, comprising:
   adjusting an output load of a power controlling unit so that a received signal strength indication of the wireless transmission system is greater than a predetermined threshold value; such that a plurality of different load values are provided for the power controlling unit;
   detecting and recording a current consumption value corresponding to each of the load values;
   in response to a wireless module ern ting through an antenna component, selecting the bad value corresponding to the lowest of the current consumption values and applying the selected load value to the output load of the power controlling unit.

9. The power saving method according to claim 8, further comprising:
   in response to the wireless module receiving through the antenna component, adjusting the power controlling unit to an original standard load value of the power controlling unit and applying the original standard load value to the output load of the power controlling unit.

10. The power saving method according to claim 8, wherein the load value corresponding to the lowest of the current consumption values has the highest power added efficiency in all the load values.

11. The power saving method according to claim 8, wherein the power controlling unit is a power amplifier.

12. The power saving method according to claim 8, wherein the load value corresponding to the lowest of the current consumption values has the highest power added efficiency in all the load values.

13. The power saving method according to claim 8, wherein the wireless module is a Bluetooth module, a Wi-Fi module, or a ZigBee module.

* * * * *